(12) United States Patent
Contreras et al.

(10) Patent No.: US 6,356,113 B1
(45) Date of Patent: Mar. 12, 2002

(54) RECORDING CHANNEL WITH VOLTAGE-TYPE WRITE DRIVER FOR USE WITH TRANSMISSION-LINE INTERCONNECT

(75) Inventors: John T. Contreras, San Jose; David Anthony Freitas, Morgan Hill; Klaassen Berend Klaassen, San Jose, all of CA (US)

(73) Assignee: International Business Machines Corp., Armonk, NY (US)

(*) Notice: Subject to any disclaimer, the term of this patent is extended or adjusted under 35 U.S.C. 154(b) by 0 days.

(21) Appl. No.: 09/474,013

(22) Filed: Dec. 28, 1999

(51) Int. Cl.[7] .................. H03K 191/75; H03K 17/16
(52) U.S. Cl. ............................ 326/82; 326/30
(58) Field of Search ............................ 326/82, 83, 86, 326/89, 90, 30

(56) References Cited

U.S. PATENT DOCUMENTS

| | | | |
|---|---|---|---|
| 4,757,395 A | | 7/1988 | Nishikawa et al. |
| 4,798,972 A | * | 1/1989 | Melanson et al. ............ 326/87 |
| 5,111,080 A | | 5/1992 | Mizukami et al. |
| 5,264,744 A | | 11/1993 | Mizukami et al. |
| 5,422,608 A | | 6/1995 | Levesque |
| 5,559,448 A | | 9/1996 | Koenig |
| 5,578,939 A | | 11/1996 | Beers et al. |
| 5,585,741 A | | 12/1996 | Jordan |
| 5,621,335 A | | 4/1997 | Andresen |
| 5,808,478 A | | 9/1998 | Andresen |
| 6,008,665 A | * | 12/1999 | Kalb et al. ................. 326/30 |
| 6,025,742 A | * | 2/2000 | Chan ........................ 327/108 |

FOREIGN PATENT DOCUMENTS

JP        404306914 A   * 10/1992

* cited by examiner

Primary Examiner—Michael Tokar
Assistant Examiner—James H. Cho
(74) Attorney, Agent, or Firm—Morgan & Finnegan, LLP

(57) ABSTRACT

A recording channel front-end circuit for driving a write element over a transmission line interconnect provides the improved performance during writing of information. In one embodiment, the recording channel front-end circuit includes a voltage-type write driver coupled to the transmission line interconnect and operable to output a write driver signal to the transmission line interconnect and a receiver termination circuit coupling the transmission line interconnect to the write element. The receiver termination circuit may include an impedance matching network operable match a terminal impedance of the write element to be substantially equal to a characteristic impedance of the transmission line interconnect. In another embodiment, the recording channel front-end circuit includes a voltage-type write driver coupled to the transmission line interconnect and operable to output a write driver signal to the transmission line interconnect and a source termination circuit coupling the voltage-type write driver to the transmission line interconnect. The source termination circuit may include an impedance matching circuit operable match a terminal impedance of the voltage-type write driver to be substantially equal to a characteristic impedance of the transmission line interconnect.

22 Claims, 9 Drawing Sheets

RECORDING CHANNEL WITH VOLTAGE-TYPE WRITE DRIVER FOR USE WITH TRANSMISSION-LINE INTERCONNECT

FIELD OF THE INVENTION

The present invention relates to write driver circuitry for a magnetic data storage device, and in particular to a voltage-type write driver circuit for use with a transmission-line interconnect.

BACKGROUND OF THE INVENTION

Magnetic data storage devices, and in particular hard disk drive storage devices, have become an essential component in modem computer systems. An example of a well-known hard disk drive storage device 100 is shown in FIG. 1. Hard disk drive 100 includes an enclosure 101, which contains one or more magnetic media platters or disks 102, read elements 104, write elements 105, an actuator arm suspension 106, a transmission line (T/L) interconnect 108, a read/write integrated circuit 110, a flexible interconnect cable 112, and a disk enclosure connector 114. Magnetic media disks 102 store information on their surfaces. Read elements 104 and write elements 105 are mounted on actuator arm suspension 106 and are located in proximity to the surfaces of disks 102. Actuator arm suspension 106 moves transducers 104 into proximity to a selected portion of disks 102 which contains the information to be read, or which will contain the information to be recorded. Write elements 105 write information in response to input electrical signals, and read elements 104 read recorded information and output electrical signals representing the information.

The electrical signals are communicated between read/write transducers 104 and read/write integrated circuit 110 over T/L interconnect 108. Read/write integrated circuit conditions the electrical signals so that they can drive write element 105 during writing and amplifies the electrical signal from read element 104 during reading. Signals are communicated between read/write integrated circuit 110 and disk enclosure connector 114 over flexible cable 112. Disk enclosure connector 114 conducts signals with circuitry external to disk enclosure 101.

A profile view of the structure of hard disk drive 100 may be in FIG. 2. Disk 102 include two disks, 102A–B, and there are four read elements 104A–D and four write elements 105A–D. Read/write integrated circuit 110 selects one of the read or write elements, after which data can be read from or written to the selected element, as appropriate.

When comparing the spectral content of the read and write signals, the write signals have higher frequency components than the read signals due to the square wave nature of the write voltage/current signals. To achieve high-data rates, the write system must therefore employ high-frequency interconnection techniques between the read/write integrated circuit and the write elements.

In a typical hard disk drive storage system, the read/write integrated circuit is located relatively far away (approximately 5 cm) from the write and read elements. Due to the length of the T/L interconnect, it is difficult to obtain the desired performance during writing of information to the disk. The performance of the transmission line interconnect and system may be enhanced by implementing the designs disclosed in U.S. Pat. No. 5,608,591. However, problems still remain with the design of a voltage-type write driver circuit that will provide the desired performance.

SUMMARY OF THE INVENTION

The present invention is a recording channel front-end circuit for driving a write element over a transmission line interconnect that will provide the desired performance during writing of information. In one embodiment, the recording channel front-end circuit includes a voltage-type write driver coupled to the transmission line interconnect and operable to output a write driver signal to the transmission line interconnect and a receiver termination circuit coupling the transmission line interconnect to the write element. The receiver termination circuit may include an impedance matching network operable match a terminal impedance of the write element to a characteristic impedance of the transmission line interconnect.

In another embodiment, the recording channel front-end circuit includes a voltage-type write driver coupled to the transmission line interconnect and operable to output a write driver signal to the transmission line interconnect and a source termination circuit coupling the voltage-type write driver to the transmission line interconnect. The source termination circuit may include an impedance matching circuit operable match a terminal impedance of the voltage-type write driver to a characteristic impedance of the transmission line interconnect.

In one aspect of the present invention the voltage-type write driver may include a voltage reference circuit operable to output a selectable voltage and an output driver operable output voltage driving signals representing write data signal transitions, the output voltage driving signals having an amplitude depending on the selected voltage output from the voltage reference source. The voltage-type write driver may further include a write gate circuit operable to enable the voltage-type write driver when in a write mode operation and disable the voltage-type write driver when not in a write mode operation. The voltage-type write driver may further include an output driver circuit comprising field effect transistors. The voltage-type write driver may further include an output driver circuit comprising bipolar transistors and the voltage reference circuit is further operable to output a selectable voltage including a diode offset voltage. The voltage-type write driver may further include a digital select interface coupled to the voltage reference circuit operable to receive digital signals indicated a selected voltage and to control the voltage reference circuit so as to output the selected voltage.

In another aspect of the present invention, the output driver circuit may include an output driver circuit having two outputs, each output operable to output a signal having two levels, a first level being dependent on a reference voltage. The output driver may further include a pair of inverter circuits, each inverter circuit operable to drive one of the two outputs, the inverter circuits operable to drive a first output with the first level and a second output with a second level or the first output with the second level and the second output with the first level. Each inverter circuit may include field effect transistors or each inverter circuit may include bipolar transistors. If the inverter circuit includes bipolar transistors, the inverter circuit may include a voltage clamping circuit.

The present invention is advantageous when used in a magnetic data storage device.

BRIEF DESCRIPTION OF THE DRAWINGS

The details of the present invention, both as to its structure and operation, can best be understood by referring to the accompanying drawings, in which like reference numbers and designations refer to like elements.

DETAILED DESCRIPTION OF THE INVENTION

Figure 1:
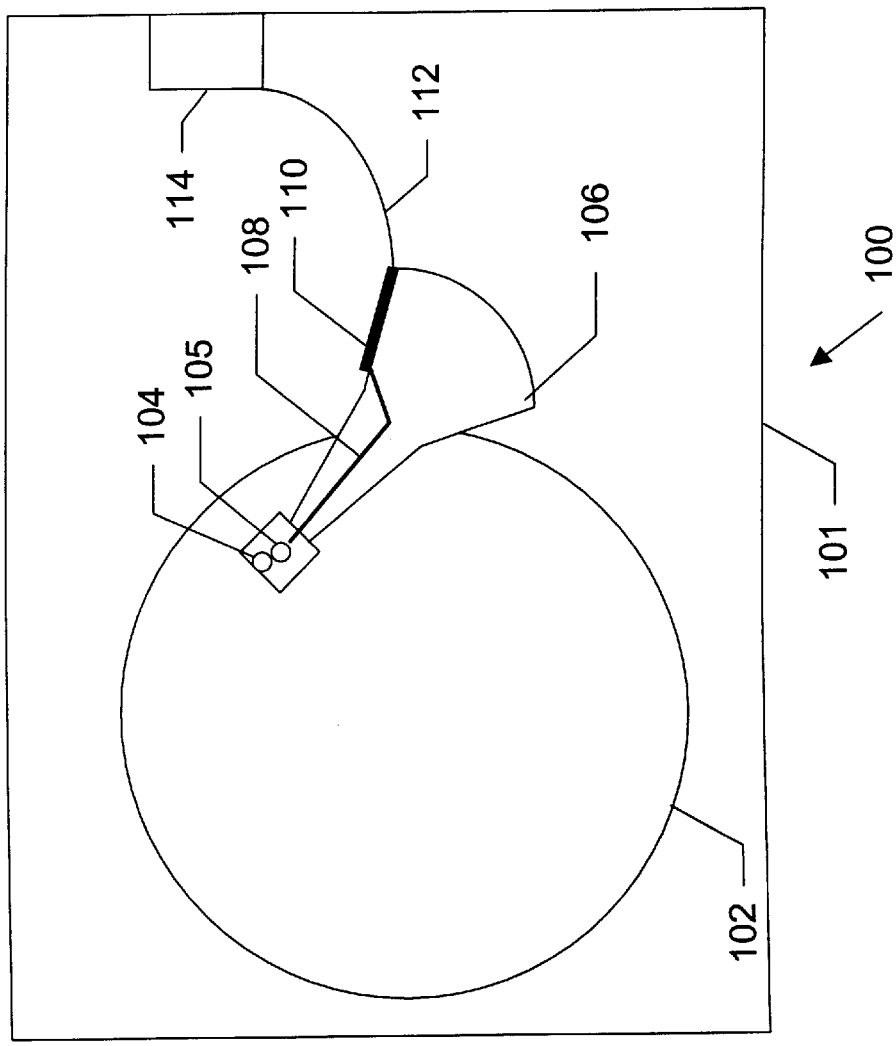
FIG. 1 is a bock diagram of a prior art hard disk drive storage system.
Figure 2:
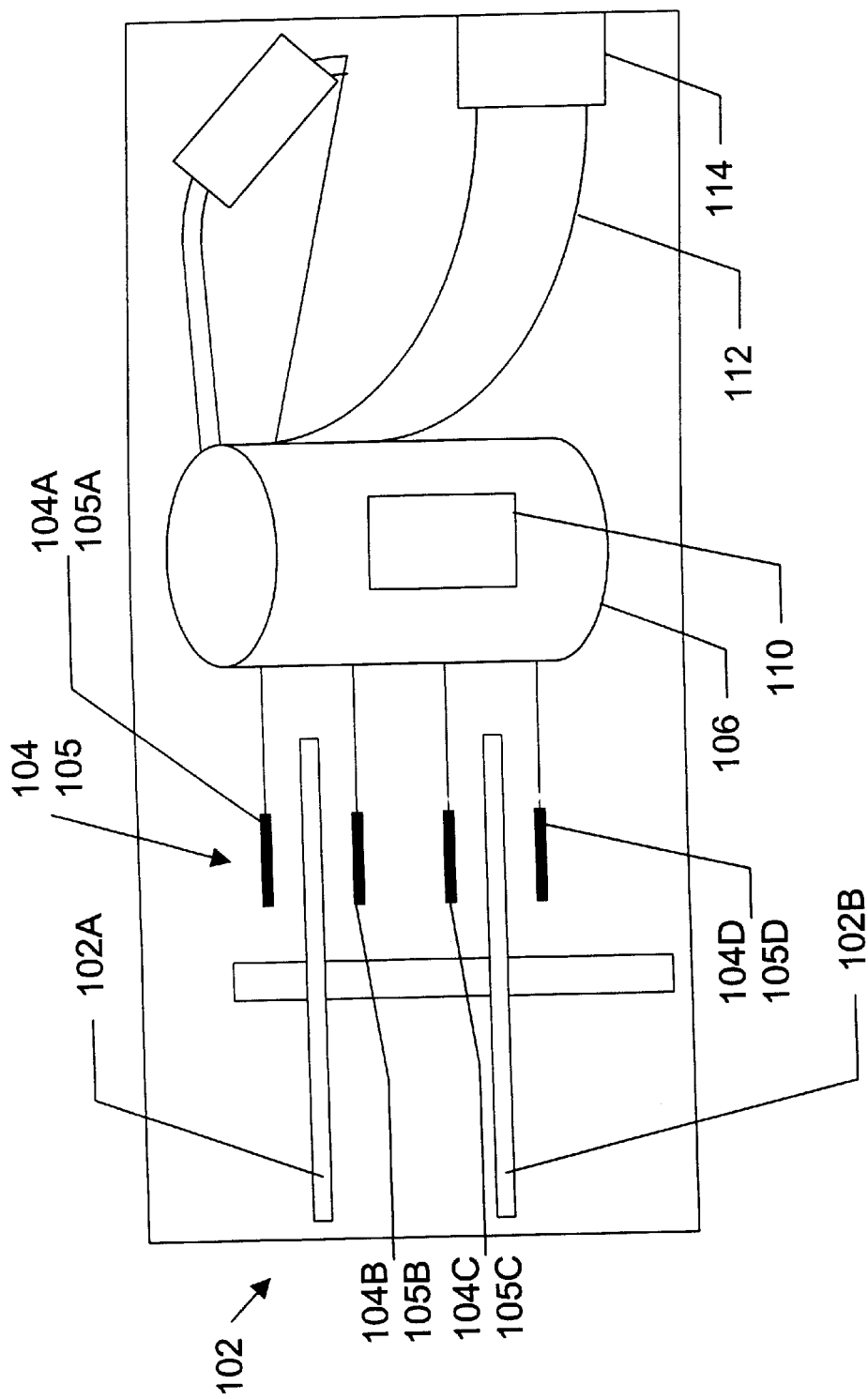
FIG. 2 is another block diagram of a prior art hard disk drive storage system.
Figure 3:
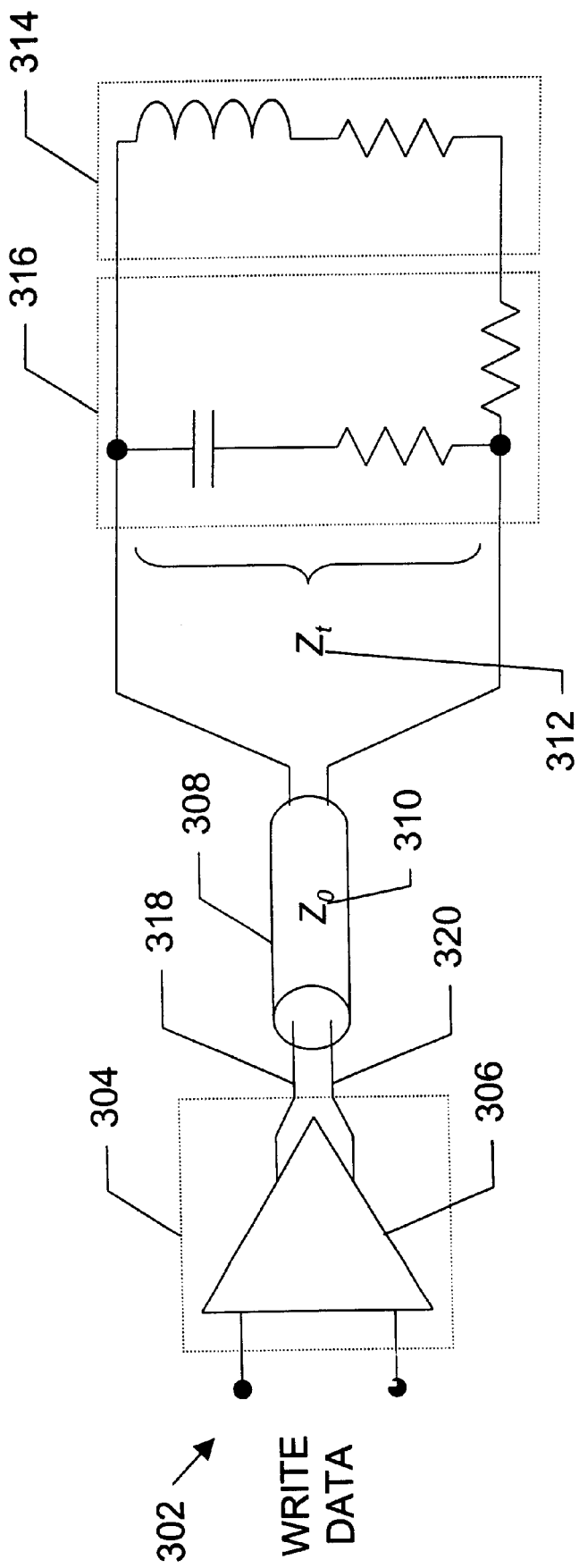
FIG. 3 is an exemplary diagram of an embodiment of the present invention for receiver termination.

An exemplary diagram of a recording channel front-end circuit with a receiver-terminated impedance-matching scheme, according to one embodiment of the present invention, is shown in FIG. 3. Write data is input to terminals 302 of read/write integrated circuit 304. The write data signal is conditioned by voltage-type write driver (VTW) 306 to levels appropriate to drive the write element during writing. The conditioned write data signal is output from read/write integrated circuit 304 into transmission line (T/L) interconnect 308, which has a characteristic impedance $Z_0$ 310. In the receiver-terminated scheme, the terminal impedance $Z_t$ 312 of the receiver, write element 314, is adjusted to be substantially equal to $Z_0$ by load termination network 316. Load termination network 316 is located on the write element end of T/L interconnect 308. For the receiver-terminated scheme, the VTW circuit delivers write voltage signals to the write element. The write voltage signals are output from VTW output driver nodes 318 and 320 to T/L interconnect 308.

Figure 4:
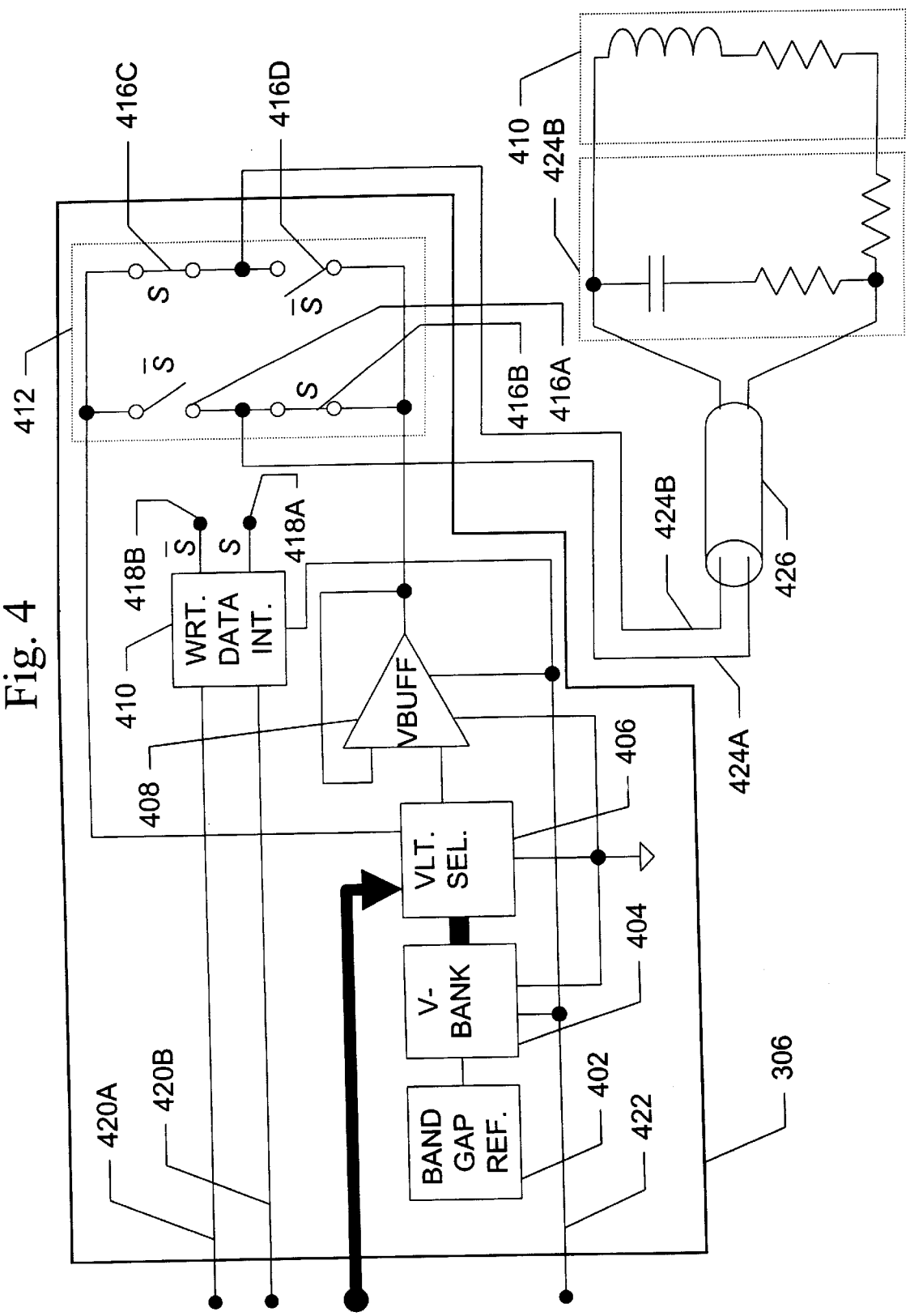
FIG. 4 is a more detailed exemplary diagram of the embodiment of the present invention shown in FIG. 3.

A more detailed exemplary diagram of the circuit of FIG. 3 is shown in FIG. 4. As shown in FIG. 4, VTW 306 includes bandgap reference 402, vbank circuit 404, voltage select circuit 406, voltage buffer 408, write data interface circuitry 410, and output driver circuit 412. Bandgap reference 402 is a well-known bandgap voltage reference circuit that supplies an accurate and stable reference voltage, which is input to vbank circuit 404. Vbank circuit 404 generates multiple reference voltages based in the input reference voltage. The multiple reference voltages are input to voltage select circuit 406, which under the control of digital select interface 414, selects and outputs one of the multiple voltage reference levels. Preferably, digital select interface 414 is a serial digital interface, which may reduce the pin count of the read/write integrated circuit, but other interface configurations, such as a parallel interface, may be used as well.

The selected reference voltage from voltage select circuit 406 is input to voltage buffer 408, which is a unity gain amplifier that supplies a reference voltage, termed $V_{set}$, to output driver circuit 412. In FIG. 4, output driver circuit 412 is represented by switches 416A–D, which are controlled by logic levels S 418A and $\overline{S}$ 418B. Logic levels S 418A and $\overline{S}$ 418B are generated by write data interface in response to write data signals input on write data inputs 420A–B. By controlling the logic levels S 418A and $\overline{S}$ 418B, write data interface circuit 410 converts the write data signal transitions into voltage driving signals. The amplitude of the voltage driving signals, termed $V_w$, is defined as:

$V_w = V_{cc} - V_{set}$, where $V_{cc}$ is the supply voltage to the VTW and $V_{set}$ is the selected reference voltage output from voltage buffer 408.

The write gate input 422 is used to enable the VTW circuitry when in a write mode operation and disable the VTW circuitry when not in a write mode operation.

The voltage driving signals are output from VTW 412 over output driver nodes 424A–B, through T/L interconnect 426. The terminal impedance $Z_t$ of the receiver, write element 428, is matched to the characteristic impedance $Z_0$ of T/L interconnect 426 by load termination network 430.

Figure 5:
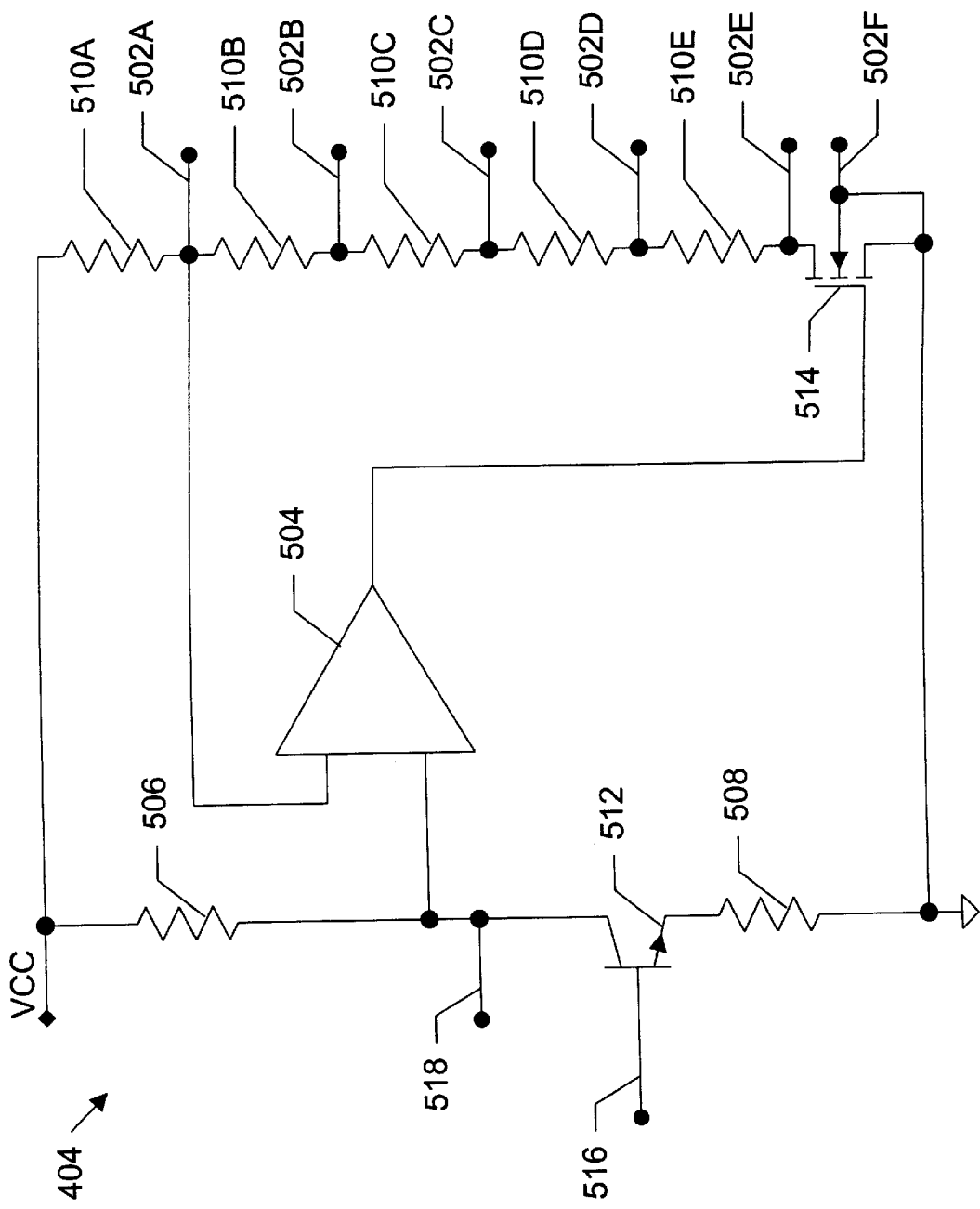
FIG. 5 is an exemplary diagram of a vbank circuit shown in FIG. 4.

An example of vbank circuit 404 of FIG. 4 is shown in FIG. 5. In the exemplary vbank circuit shown in FIG. 5, circuit 404 supplies six reference voltages, one reference voltage from each output 502A–F. Circuit 404 includes amplifier 504, resistors 506, 508, and 510A–E, transistor 512 and transistor 514. Amplifier 504 is preferably an operational transconductance amplifier. Transistor 512 is preferably a bipolar transistor, while transistor 514 is preferably a field effect transistor (FET), such as a junction FET (JFET) or a metal-oxide semiconductor FET (MOSFET).

The output from bandgap reference 402 of FIG. 4, termed $V_{bg}$, plus a one diode voltage, termed $V_{be}$, is input to vbank circuit 404 at input 516. The bandgap voltage output $V_{bg}$ is accurate with respect to a common ground between bandgap reference 402 and vbank circuit 404. The diode voltage $V_{be}$ is included for temperature compensation. Resistors 506 and 508 are fabricated with the same integrated circuit process type, which results in their resistances tracking relatively accurately. As a result, the voltage at node 518 will be relatively accurate with respect to the supply voltage $V_{cc}$. Amplifier 504 forms a feedback loop that provides accurate reference voltages with respect to $V_{cc}$. The feedback loop forces the voltage at output 502A to be equal to the voltage at node 518. Resistors 510A–E are of the same integrated circuit process type, which results in their resistances tracking relatively accurately. Thus, the voltages on outputs 502B–E track the voltage on output 502A relatively accurately.

Amplifier 504 and transistor 514 are well-known designs. The capacities and sizes of these components can easily be determined by one of ordinary skill in the art.

Figure 6:
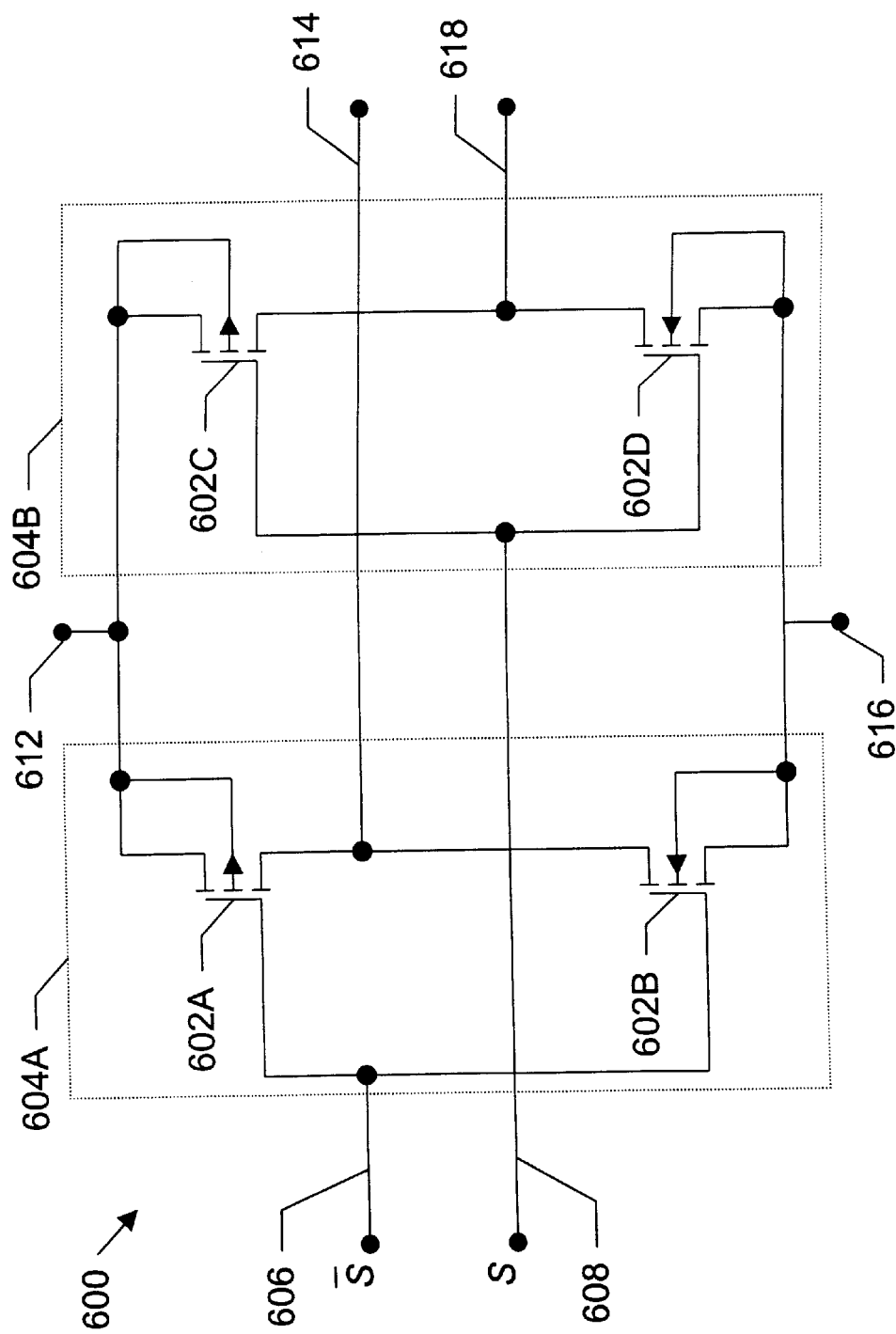
FIG. 6 is an exemplary diagram of one embodiment of an output driver circuit shown in FIG. 4.

An example of one embodiment of output driver circuit 412 of FIG. 4 is shown in FIG. 6. This embodiment, designated circuit 600, includes FET transistors 602A–D, which may be JFETs or MOSFETs.

Circuit 600 includes two inverter circuits 604A and 604B, each of which includes one n-channel and one p-channel FET. For example, inverter circuit 604A includes p-channel FET 602A and n-channel FET 602B, while inverter circuit 604B includes p-channel FET 602C and n-channel FET 602D.

Circuit 600 is controlled by inputs 606 and 608. Input 606 is connected to the $\overline{S}$ 418B output of write data interface circuit 410 and input 608 is connected to the S 418A output of write data interface circuit 410. All FETs 602A–D are relatively large in area, so the drain-to-source resistances of the FETs are small compared to the characteristic impedance $Z_0$ of the transmission line interconnect. When S, on input 608, is at a logic high level, and $\overline{S}$, on input 606, is at a logic low level, FET 602A and FET 602D conduct, driving the write element through the transmission line interconnect. In this state, $V_{cc}$ 612 is connected to node 614 and $V_{set}$ is connected to node 618. When the logic levels are reversed, FET 602C and FET 602B conduct, again driving the write element through the transmission line interconnect. However, in this state, $V_{cc}$ 612 is connected to node 618 and $V_{set}$ 616 is connected to node 614. In both states, the voltage applied to the write element through the transmission line interconnect is $V_w = V_{cc} - V_{set}$. However, the polarity of $V_w$ is reversed between the two states.

Figure 7:
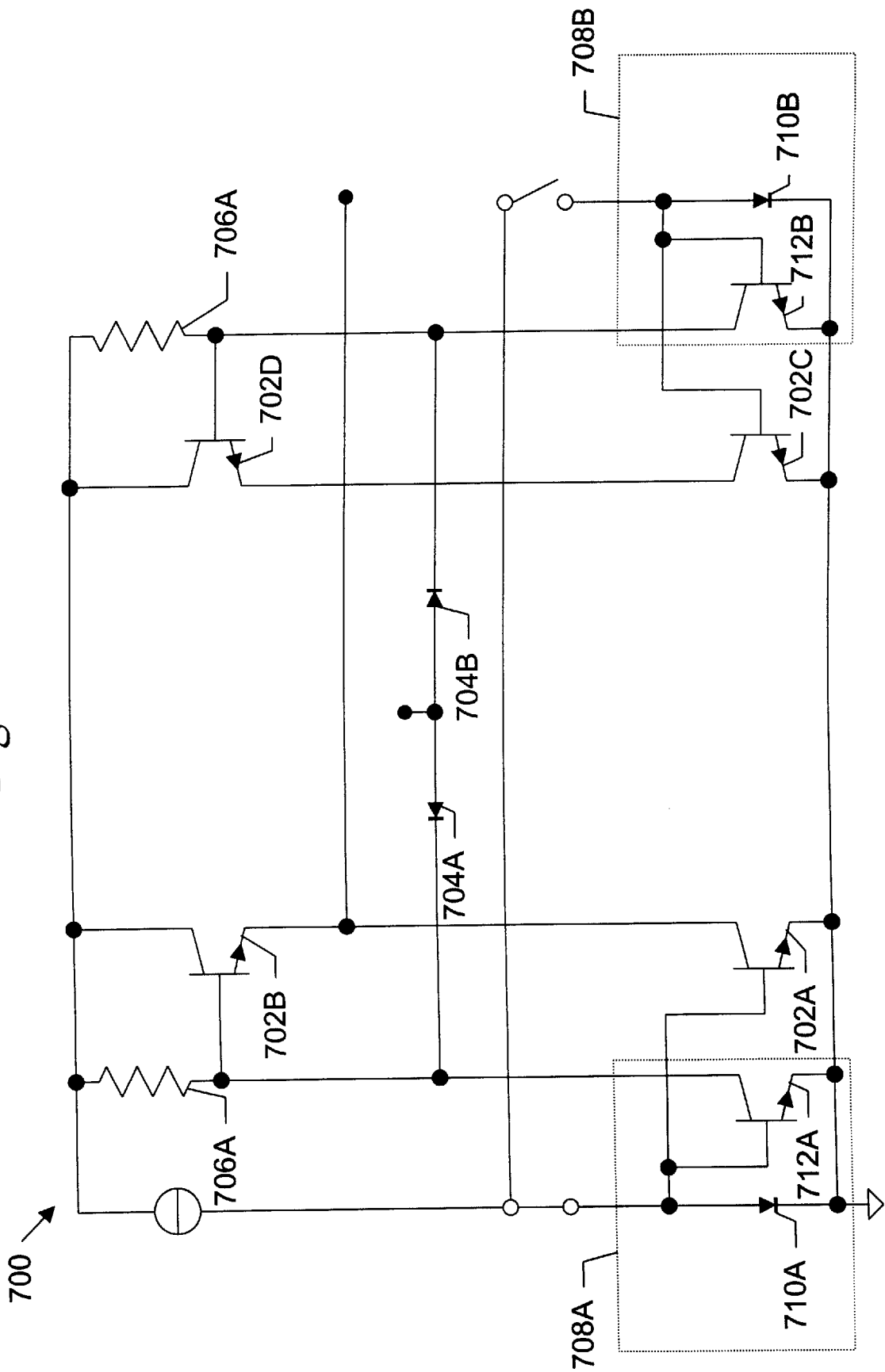
FIG. 7 is an exemplary diagram of another embodiment of an output driver circuit shown in FIG. 4.

An example of another embodiment of output driver circuit 412 of FIG. 4 is shown in FIG. 7. This embodiment, designated circuit 700, includes bipolar transistors 702A–F, diodes 704A–D, and resistors 706A–B. This embodiment of output driver is similar to the H-driver described in U.S. Pat. No. 5,296,975 to Contreras et al., hereby incorporated by reference. However, in the present invention, the H-driver of Contreras et al. is enhanced by the addition of voltage clamping circuits 708A–B, each of which includes a diode 710A or 710B and a transistor 712A or 712B. The $V_{set}$ reference includes a diode voltage offset, resulting in a write drive voltage of $V_w = V_{cc} - V_{set}$, as for the FET embodiment.

Figure 8:
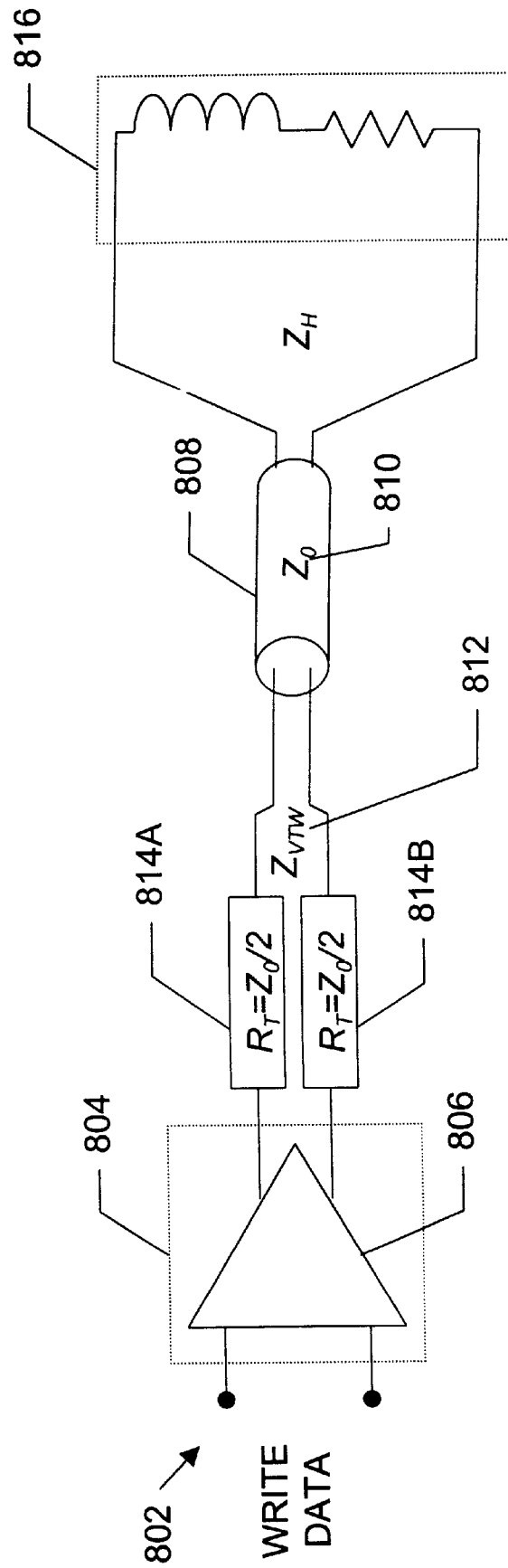
FIG. 8 is an exemplary diagram of another embodiment of the present invention for source termination.

An exemplary diagram of a circuit implementing a source-terminated impedance-matching scheme, according to one embodiment of the present invention, is shown in FIG. 8. Write data is input to terminals 802 of read/write integrated circuit 804. The write data signal is conditioned by VTW 806 to levels appropriate to drive the read/write transducer during writing. The conditioned write data signal is output from read/write integrated circuit 804 into transmission line (T/L) interconnect 808, which has a characteristic impedance $Z_0$ 810. In the source-terminated scheme, the terminal impedance $Z_{vtw}$ 812 of VTW 806, is substantially equal to the characteristic impedance $Z_0$ 810 of T/L interconnect 808. Source terminations 814A–B are connected to the output of VTW 806 between VTW 806 and T/L interconnect 810. Typically, source terminations 814A–B are resistors, which preferably have the value $Z_0/2$. In this case, the source termination resistors would typically be integrated into the read/write integrated circuit 804 and would be constructed using typical integrated circuit processing techniques. VTW 806 is similar to that used in the receiver-terminated embodiment.

Figure 9:
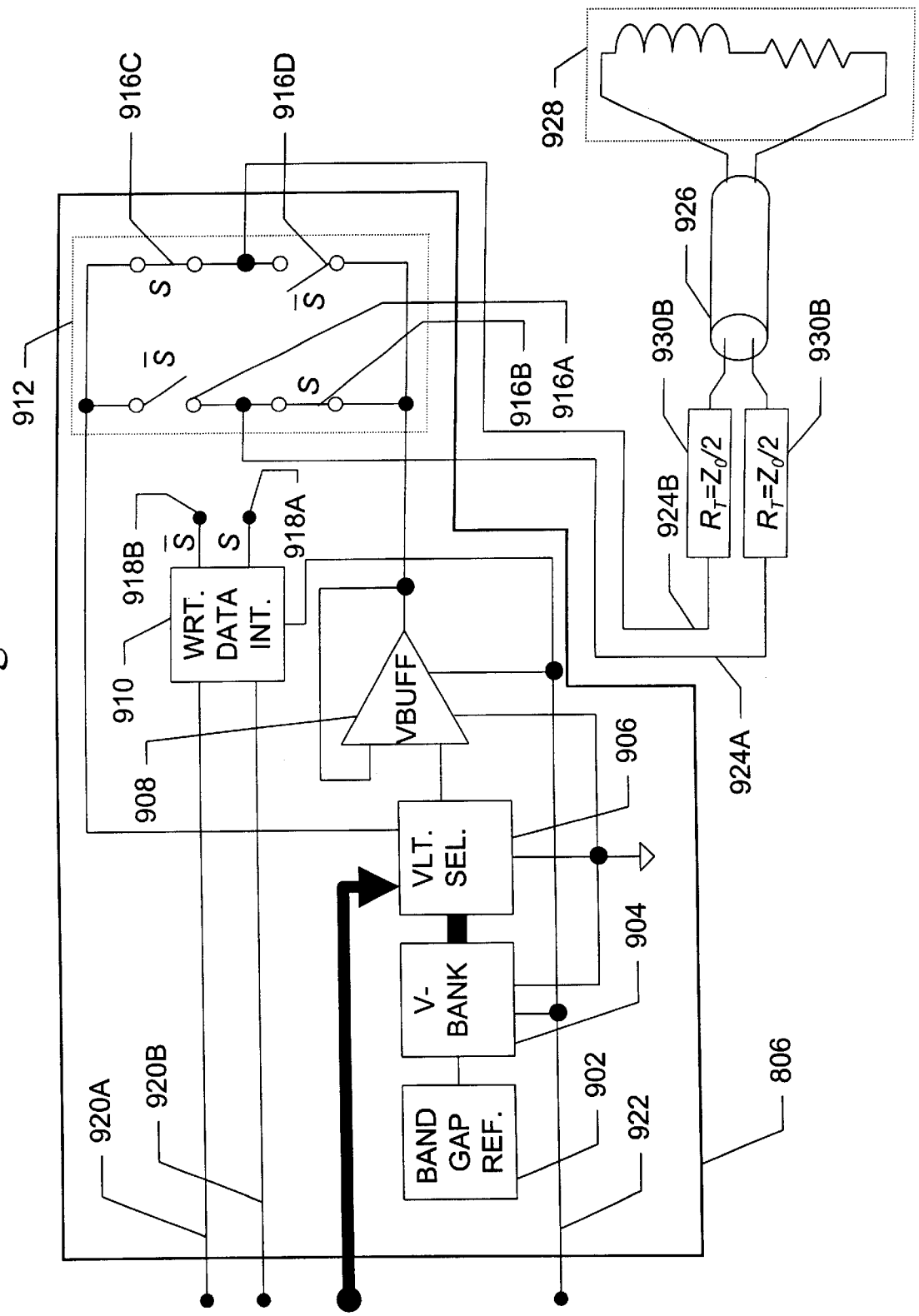
FIG. 9 is a more detailed exemplary diagram of the embodiment of the present invention shown in FIG. 8.

A more detailed exemplary diagram of the circuit of FIG. 8 is shown in FIG. 9. As shown in FIG. 9, VTW 806 includes bandgap reference 902, vbank circuit 904, voltage select circuit 906, voltage buffer 908, write data interface circuitry 910, and output driver circuit 912. Bandgap reference 902 is a well-known bandgap voltage reference which supplies an accurate and stable reference voltage, which is input to vbank circuit 904. Vbank circuit 904 generates multiple reference voltages based in the input reference voltage. The multiple reference voltages are input to voltage select circuit 906, which under the control of digital select interface 914, selects and outputs one of the multiple voltage reference levels. Preferably, digital select interface 914 is a serial digital interface, which may reduce the pin count of the read/write integrated circuit, but other interface configurations, such as a parallel interface, may be used as well.

The selected reference voltage from voltage select circuit 906 is input to voltage buffer 908, which is a unity gain amplifier that supplies a reference voltage to output driver circuit 912. In FIG. 9, output driver circuit 912 is represented by switches 916A–D, which are controlled by logic levels S 918A and $\overline{S}$ 918B. Logic levels $\overline{S}$ 918A and 3 918B are generated by write data interface in response to write data signals input on write data inputs 920A–B. By controlling the logic levels S 918A and $\overline{S}$ 918B, write data interface circuit 910 converts the write data signal transitions into voltage driving signals. The voltage driving signals, termed $V_w$, defined as:

$$V_w = V_{cc} - V_{set}.$$

The write gate input 922 is used to turn off the VTW circuitry when not in a write mode operation.

The voltage driving signals are output from VTW 806 over output driver nodes 924A–B, through T/L interconnect 926 to drive write element 928. The terminal impedance $Z_{vtw}$ of VTW 806, is substantially equal to the characteristic impedance $Z_0$ of T/L interconnect 926. Source terminations 930A–B are connected to output nodes 924A–B of VTW 806 between VTW 806 and T/L interconnect 926.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A data storage recording channel front-end circuit for driving a write transducer over a transmission line interconnect, the circuit comprising:

a voltage-type write driver coupled to the transmission line interconnect and operable to output a write driver signal to the transmission line interconnect, wherein the voltage-type write driver comprises a voltage reference source operable to output a selectable voltage, and an output driver operable output voltage driving signals representing write data signal transitions, the output voltage driving signals resulting in a write transducer current amplitude depending on a selected voltage output from the voltage reference source; and a receiver termination circuit coupling the transmission line interconnect to the write transducer.

2. The circuit of claim 1, wherein the receiver termination circuit comprises:

an impedance matching network operable match a terminal impedance of the write transducer to be substantially equal to a characteristic impedance of the transmission line interconnect.

3. The circuit of claim 2, wherein the voltage-type write driver further comprises:

a write gate circuit operable to enable the voltage-type write driver when in the write mode operation and disable the voltage-type write driver when not in a write mode operation.

4. The circuit of claim 2, wherein the voltage-type write driver further comprises:

an output driver circuit comprising field effect transistors.

5. The circuit of claim 2, wherein the voltage-type write driver further comprises:

an output driver circuit comprising bipolar transistors and the voltage reference circuit is further operable to output a selectable voltage including a diode offset voltage.

6. The circuit of claim 2, wherein the voltage-type write driver further comprises:

a digital select interface coupled to a voltage reference source operable to receive digital signals indicated a selected voltage and to control the voltage reference source so as to output a required current level for the write transducer.

7. The circuit of claim 2, wherein the output driver circuit comprises:

an output driver circuit having two outputs, each output operable to output a signal having two levels, a first level being dependent on a reference voltage.

8. The circuit of claim 7, wherein the output driver further comprises:

a pair of inverter circuits, each inverter circuit operable to drive one of the two outputs, the inverter circuits operable to drive a first output with the first level and a second output with a second level or the first output with the second level and the second output with the first level.

9. The circuit of claim 8, wherein each inverter circuit comprises field effect transistors.

10. The circuit of claim 8, wherein each inverter circuit comprises bipolar transistors.

11. The circuit of claim 10, wherein each inverter circuit further comprises a voltage clamping circuit.

12. A recording channel front-end circuit for driving a write element over a transmission line interconnect, the circuit comprising:

a voltage-type write driver coupled to the transmission line interconnect and operable to output a write driver signal to the transmission line interconnect; and a source termination circuit coupling the voltage-type write driver to the transmission line interconnect.

13. The circuit of claim 12, wherein the source termination circuit comprises:

an impedance matching circuit operable match a terminal impedance of the voltage-type write driver to be substantially equal to a characteristic impedance of the transmission line interconnect.

14. The circuit of claim 13, wherein the voltage-type write driver further comprises:

a write gate circuit operable to enable the voltage-type write driver when in the write mode operation and disable the voltage-type write driver when not in a write mode operation.

15. The circuit of claim 13, wherein the voltage-type write driver further comprises:

an output driver circuit comprising field effect transistors.

16. The circuit of claim 13, wherein the voltage-type write driver further comprises:

an output driver circuit comprising bipolar transistors and the voltage reference circuit is further operable to output a selectable voltage including a diode offset clamp.

17. The circuit of claim 13, wherein the voltage-type write driver further comprises:

a digital select interface coupled to the voltage reference circuit operable to receive digital signals indicated a selected voltage and to control the voltage reference circuit so as to output a required current level for the write transducer.

18. The circuit of claim 13, wherein the output driver circuit comprises:

an output driver circuit having two outputs, each output operable to output a signal having two levels, a first level being dependent on a reference voltage.

19. The circuit of claim 18, wherein the output driver further comprises:

a pair of inverter circuits, each inverter circuit operable to drive one of the two outputs, the inverter circuits operable to drive a first output with the first level and a second output with a second level or the first output with the second level and the second output with the first level.

20. The circuit of claim 19, wherein each inverter circuit comprises field effect transistors.

21. The circuit of claim 19, wherein each inverter circuit comprises bipolar transistors.

22. The circuit of claim 21, wherein each inverter circuit further comprises a voltage clamping circuit.

* * * * *